United States Patent [19]

Parks

[11] Patent Number: 4,860,062
[45] Date of Patent: Aug. 22, 1989

[54] DEVICE AND METHOD FOR MEASURING REFLECTIVE NOTCH CONTROL IN PHOTORESISTS

[75] Inventor: Gary D. Parks, Wayland, Mass.
[73] Assignee: Shipley Company Inc., Newton, Mass.
[21] Appl. No.: 196,656
[22] Filed: May 20, 1988
[51] Int. Cl.$^4$ .............................................. G03B 27/42
[52] U.S. Cl. ...................................... 355/53; 355/77; 356/237; 430/8; 430/318
[58] Field of Search ................... 355/53, 77; 356/237; 430/8, 318

[56] References Cited

U.S. PATENT DOCUMENTS

| | | | |
|---|---|---|---|
| 4,317,876 | 3/1982 | Haering | 430/8 |
| 4,437,760 | 3/1984 | Ausschnitt | 355/53 |
| 4,681,430 | 7/1987 | Goel et al. | 355/53 |
| 4,780,747 | 10/1988 | Suzuki et al. | 355/53 |
| 4,803,524 | 2/1989 | Ohno et al. | 355/53 |

OTHER PUBLICATIONS

"IEDM International Electron Device Meeting", Lin et al., San Francisco, Calif., Dec. 13-15, 1982, pp. 399-402.

Primary Examiner—Monroe H. Hayes
Attorney, Agent, or Firm—Robert L. Goldberg

[57] ABSTRACT

A simple, inexpensive device and method are disclosed for measuring the effectiveness of a photoresist composition in controlling reflective notching. The device utilized in practicing the method is a metalized silicon wafer having a U-shaped image thereon. This wafer may be coated with a photoresist, exposed through a grating pattern and developed, whereby the degree of notching of the photoresist lines may be readily observed.

15 Claims, 3 Drawing Sheets

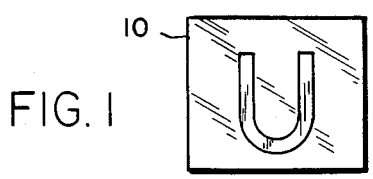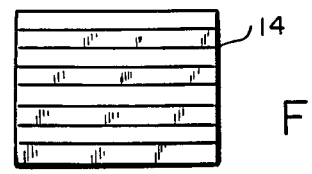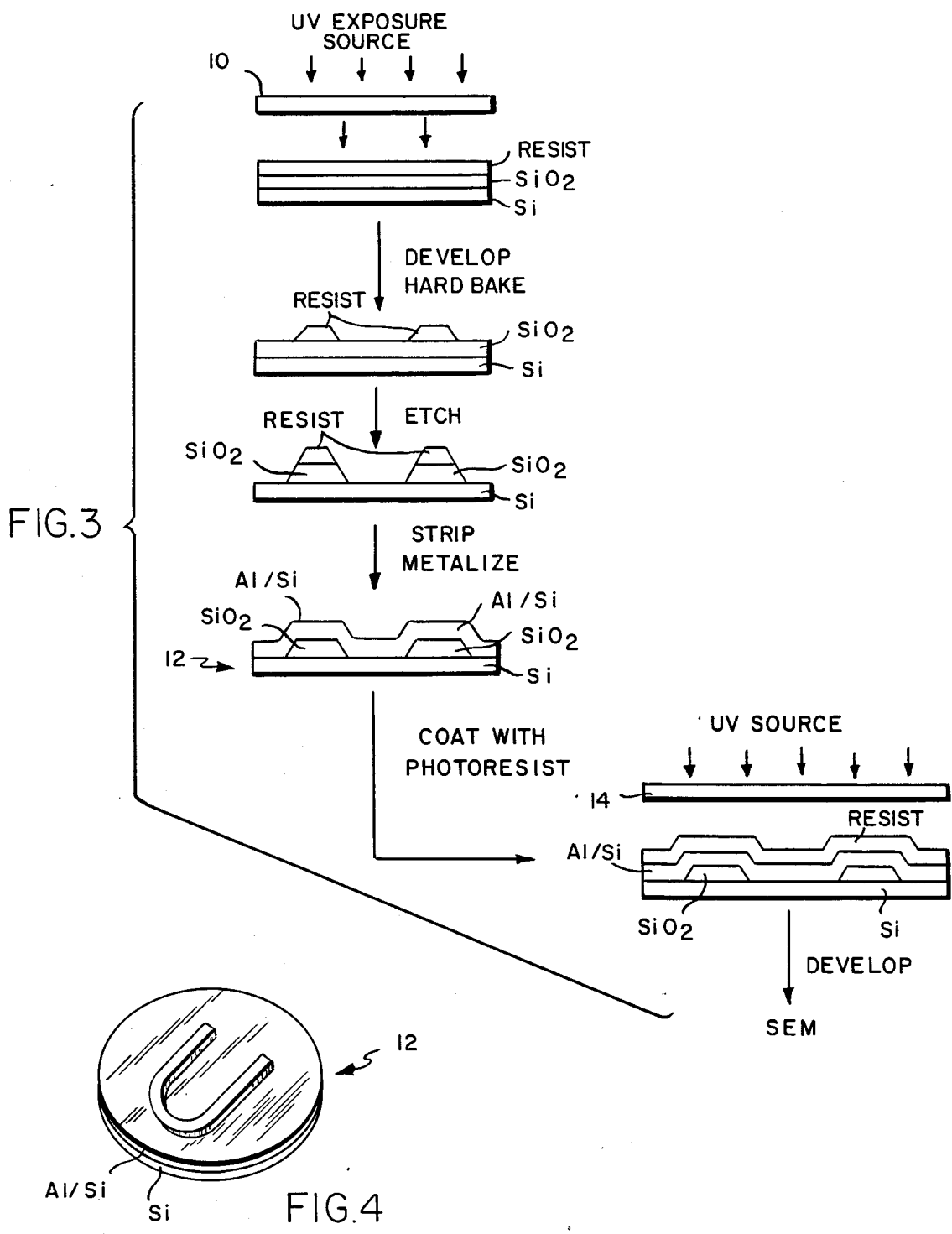

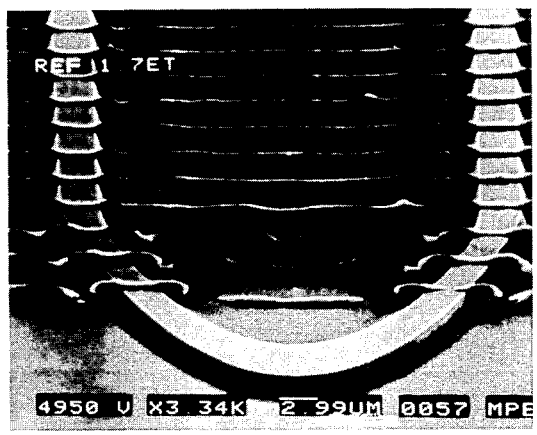
S1400
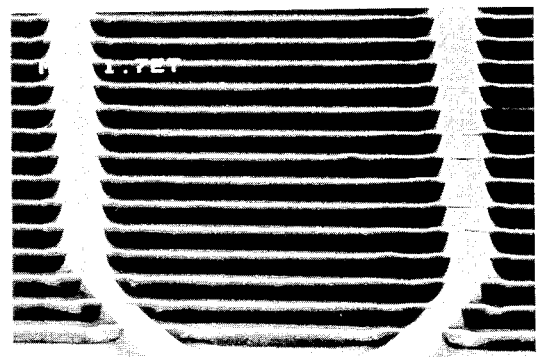
S1418 J2
FIG. 6

DEVICE AND METHOD FOR MEASURING REFLECTIVE NOTCH CONTROL IN PHOTORESISTS

BACKGROUND OF INVENTION

This invention relates to a device and a method for measuring the extent of reflective notching in photoresists.

Photoresist compositions are well known in the art for use in the fabrication of integrated circuits. Such compositions are either negative acting, where they become insoluble in developer upon exposure to actinic (activating light) radiation, or positive acting, where they become soluble in developer upon light exposure. Positive photoresists are generally considered superior with respect to resolution and aspect ratio.

Present techniques in optical projection printing (such as step and repeat cameras) can resolve images of one micron and below in photoresists with good linewidth control when planar, low reflectivity substrates are used. However, when photoresists on substrates with surface topography are exposed, there are resist-control linewidth problems introduced by optical reflections and by resist thickness non-uniformity (bulk effects).

Reflection of light from the substrate/resist interface produces variations in the light intensity and scattering in the resist during exposure, resulting in non-uniform photoresist linewidth upon development. Light can scatter from the interface into regions of the resist where exposure was not intended, resulting in linewidth variations. The amount of scattering and reflection will typically vary from region to region resulting in linewidth non-uniformity.

To eliminate the effects of chromatic aberration in exposure equipment lenses, monochromatic or quasi-monochromatic light is commonly used in resist projection techniques. Unfortunately, due to resist/substrate interface reflections, constructive and destructive interference is particularly significant when monochromatic or quasi-monochromatic light is used for photoresist exposure. In such cases the reflected light interferes with the incident light to form standing waves within the resist. In the case of highly reflective substrate regions, the problem is exacerbated since large amplitude standing waves create thin layers of underexposed resist at the wave minima. The underexposed layers can prevent complete resist development causing edge acuity problems in the resist profile. The time required to expose the photoresist is generally an increasing function of resist thickness because of the increased total amount of light required to expose an increased amount of resist. However, because of the standing wave effect, the time of exposure also includes a harmonic component which varies between successive maximum and minimum values with the resist thickness. This effect is observed for quarter wavelengths of the incident light. If the resist thickness is non-uniform, the problem becomes more severe, resulting in variable linewidth control.

Linewidth control problems also arise from substrate topography. Any image on the wafer will cause impinging light to scatter or reflect in various uncontrolled directions, affecting the uniformity of resist development. As the topography becomes more complex with efforts to design more complex circuits, the effects of reflected light become much more critical.

Various attempts have been made in the art to reduce scattering and reflection during exposure of photoresists and thereby eliminate or minimize reflective notching. One such effort involves the addition of dyes to photoresist compositions that absorb at or near the wavelength used to expose the photoresist. Typical dyes that have been used for this purpose include the coumarin family, methyl orange and methanil yellow. Considerable improvement in linewidth control and reflective notching has been achieved in this manner.

However, there now arises a need among integrated circuit and photoresist manufacturers to measure the effectiveness of a particular photoresist composition in controlling or minimizing reflective notching in a simple and inexpensive manner.

SUMMARY

In accordance with the present invention, a simple, inexpensive device and method are disclosed for measuring the effectiveness of a photoresist composition in controlling reflective notching. The device utilized in practicing the method is a metalized silicon wafer having a U-shaped image thereon. This wafer may be coated with a photoresist, exposed through a grating pattern and developed, whereby the degree of notching of the photoresist lines may be readily observed.

BRIEF DESCRIPTION OF THE DRAWINGS

FIG. 1 is a top plan view of a reticle used to create the desired image on a silicon wafer for use in the test method of the present invention.

FIG. 2 is a top plan view of a reticle used to create the line/space grating pattern for use in the test method of the present invention.

FIG. 3 is a flow chart which illustrates the fabrication of the device and the test method of the present invention.

FIG. 4 illustrates a perspective view of the metalized silicon wafer having a U-shaped image for use in the test method of the present invention.

FIG. 6 depicts comparative SEM photomicrographics of two photoresists observed after testing them in accordance with the method of the present invention.

DESCRIPTION OF THE INVENTION

Figure 5:
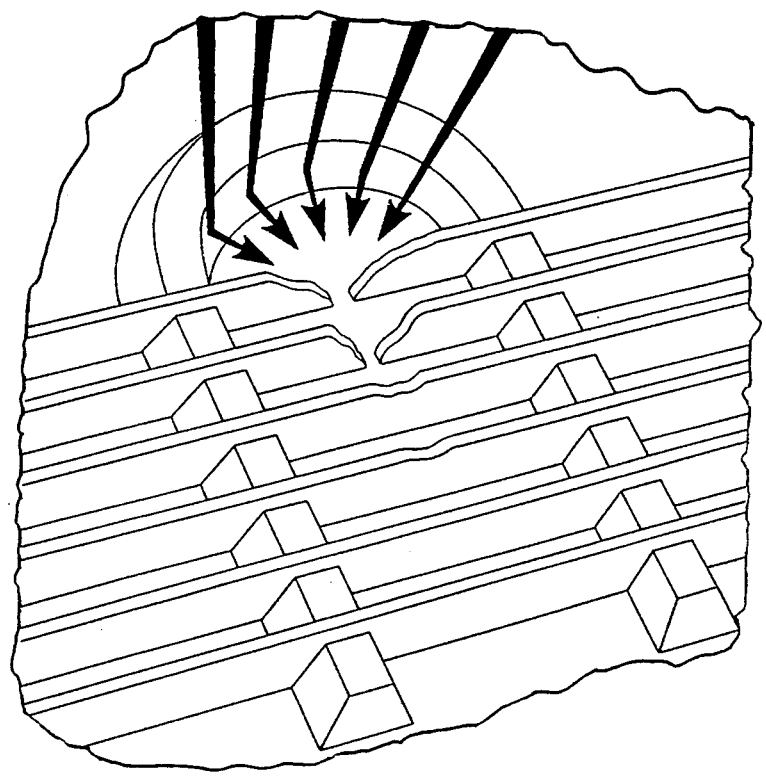
FIG. 5 illustrates the manner in which reflected light notching is observed utilizing the test method of the present invention.

The invention may be best described and more readily understood with reference to the accompanying drawings.

In FIG. 3 there is shown a flow chart which outlines a method for fabricating a metalized wafer for use in the test method of the present invention, and the test method itself. A silicon dioxide coated silicon wafer is first coated with a photoresist in the conventional manner, softbaked, then exposed to activating radiation through a mask or reticle (10), as illustrated in FIG. 1, which has a U-shaped pattern. In the case of a positive photoresist, the pattern on the reticle is completely opaque to the impinging radiation. Following exposure, the wafer is developed and hardbaked in the conventional manner to provide a U-shaped photoresist image. This wafer is then etched in the customary manner to remove the silicon oxide layer not protected by the resist. The resist is then stripped off and a metal layer applied to the wafer, typically by sputtering or evaporation, to provide a metalized wafer (12) which has a topography bearing the desired U-shaped image (see FIG. 4).

The U-shaped image preferably consists of a 5.0 micron linewidth image with two parallel legs 50 microns apart (center to center) and approximately 50 microns long connected at one end with an approximately spherical (equal arc) or parabolic (non-equal arc) curved portion. The image has a slope (that is, the angle formed between the image sidewall and the plane of the wafer surface) of between about 60° to 85°, preferably 70° to 75°. The depth of the image is about 1.0 micron.

The metalized test wafer may then be utilized to test photoresists for their effectiveness in controlling or minimizing reflective notching (i.e. linewidth non-uniformity caused by reflected light). The test wafer (12) is coated with the photoresist to be tested and softbaked in the usual manner. This photoresist coated test wafer is exposed to activating radiation through a mask or reticle designed to provide a uniform line/space grating pattern, such as shown in FIG. 2, then developed in the usual manner. This test wafer may then be observed, for example under a scanning electron micrograph, to determine the extent of notching in the grating pattern. Such notching will typically appear as depicted in FIG. 5.

FIG. 5 also illustrates the mechanism underlying the operation of the present test method wherein reflected light (indicated by the arrows) is focused by the U-shaped image to the central part of the grating pattern. In this way, the effect of the reflected light is amplified so that any degradation in linewidth can be more readily observed and measured. It should be understood that while the U-shaped pattern is preferred and is believed to provide optimum test results, other geometric patterns which will focus reflected light may be coupled with the same or different grating patterns to achieve a similar result.

EXAMPLE

Silicon wafers with a 1.1 micron $SiO_2$ layer were spin coated with a standard positive photoresist (S1400-27 available from Shipley Company Inc. of Newton, Mass.) at 5050 RPM for 30 seconds using a GCA Wafertrack 1000, then baked on a hot plate at 110° C. for 45 seconds to provide a photoresist coating of 1.23 microns. The coated wafers were exposed with a GCA 6300 wafer stepper at a wavelength of 436 nm through a 5x quartz reticle. The energy level for the exposure was set to provide a 5.0 micron line. The reticle had the configuration shown in FIG. 1 to provide a U-shaped image on the wafer with the following dimensions: two 5.0 micron wide parallel leads 50 microns apart (center to center) and 50 microns long connected by equal arc segments to form the radii of curvature to merge the leads (i.e. spherical curve).

Following exposure, the wafers were developed with a suitable developer (MF-319 available from Shipley Company Inc.) using a GCA 1000 in double puddle mode for 30 seconds at ambient temperature to remove the exposed portions of the photoresist. The developed wafers were then hardbaked in the usual manner, typically at 115° C. for 45 seconds in a GCA Wafertrack 1000. The wafers were then immersion etched for six minutes in a buffered 7:1 hydrofluoric acid oxide etch to remove all the silicon oxide not protected by photoresist.

The remaining photoresist layer was then removed with a suitable photoresist stripper, which in this case was a Tegal 901 oxygen plasma stripper. The wafers were then metalized with a layer of aluminum (98% Al/2%Si) to a thickness of 1.0 micron using a Leybold-Heraeus electron beam evaporation unit (model L560Q). In this manner metalized wafers (12) with the topography depicted in FIGS. 3 and 4 were produced.

The metalized wafers thus produced were then utilized to test the performance of two different photoresists with respect to their ability to withstand reflective light notching. The photoresists tested included a standard positive photoresist (S1400—27) and a reflection control positive photoresist (S1418—J2), both available from Shipley Company Inc. Each photoresist was spin coated onto several of the metalized wafers as previously described and softbaked on a hot plate at 110° C. for 45 seconds.

The coated wafers were then exposed with a GCA 6300 stepper at a wavelength of 436 nm through a 5x quartz reticle. The reticle, as depicted in FIG. 2, is designed to provide a 1.0 micron line/space grating pattern. The energy level for the exposure was set to provide a 1.0 micron line. Following exposure, the wafers were developed as previously described and SEM photomicrographs taken. Typical SEM photomicrographs are depicted in FIG. 6 where it can be readily observed that the standard photoresist (S1400), depicted in the upper plate, suffered considerable reflective notching, whereas the photoresist with reflective notch control (S1418-J2), depicted in the lower plate, maintained extremely good linewidth control.

While the invention described in the above example refers to the use of positive photoresists, it should be readily understood that negative photoresists may also be utilized as desired. Likewise, masks may be substituted for reticles where desired. Thus, the term photoresist as used throughout the specification and claims is intended to include both positive and negative photoresists, and the term maskwork is intended to include both masks and reticles.

What is claimed is:

1. A device for measuring photoresist reflective notch control comprising a metalized silicon wafer with a topographical image thereon adapted to focus reflected light through a photoresist test pattern subsequently applied.

2. The device of claim 1 wherein the topographical image is U-shaped.

3. The device of claim 2 wherein the curved portion of the U-shaped image is spherical.

4. The device of claim 3 wherein the U-shaped image has a sidewall slope between about 60° to 85°.

5. The device of claim 4 wherein the U-shaped image has a linewidth of about 5.0 microns and a depth of about 1.0 micron.

6. A maskwork with a pattern adapted to produce the device of claims 1, 2, 3, 4, or 5.

7. The maskwork of claim 6 comprising a reticle.

8. A test kit for measuring photoresist reflective notch control comprising a pair of maskworks wherein one maskwork has a U-shaped pattern and the other maskwork has a grating pattern.

9. The test kit of claim 8 wherein the U-shaped pattern has about a 5.0 micron linewidth and the grating pattern has about a 1.0 micron line/space width.

10. A method of measuring photoresist reflective notch control which comprises coating a metalized silicon wafer with the photoresist to be tested, said metalized silicon wafer having a topographical image thereon adapted to focus reflected light through a subsequently applied photoresist test pattern, exposing said photoresist-coated, metalized silicon wafer to activating light radiation through a maskwork having a photoresist test pattern, developing the exposed photoresist to produce a photoresist test pattern image on the metalized silicon wafer, and measuring or observing any degradation of the photoresist test pattern image.

11. The method of claim 10 wherein the topographical image is U-shaped.

12. The method of claim 11 wherein the U-shaped image comprises a pair of parallel legs connected by a spherical curve.

13. The method of claim 12 wherein the U-shaped image has a linewidth of about 5.0 microns, a depth of about 1.0 micron, and a sidewall slope of about 60° to 85°, with parallel legs about 50 microns long and 50 microns apart.

14. The method of claims 11, 12 or 13 wherein the photoresist test pattern is a line/space grating pattern.

15. The method of claim 14 wherein the line/space grating pattern comprises parallel lines about 1.0 micron wide, spaced about 1.0 micron apart.

* * * * *